United States Patent [19]

Douglas et al.

[11] Patent Number: 5,201,989
[45] Date of Patent: Apr. 13, 1993

[54] ANISOTROPIC NIOBIUM PENTOXIDE ETCH

[75] Inventors: Monte A. Douglas, Coppell; Howard R. Beratan, Richardson; Scott R. Summerfelt, Dallas, all of Tex.

[73] Assignee: Texas Instruments Incorporated, Dallas, Tex.

[21] Appl. No.: 872,701

[22] Filed: Apr. 20, 1992

[51] Int. Cl.$^5$ .......................... B44C 1/22; C23F 1/00
[52] U.S. Cl. ..................................... 156/635; 156/643; 156/654; 156/659.1; 156/667; 252/79.3
[58] Field of Search ............... 156/635, 643, 654, 656, 156/659.1, 662, 667, 345; 252/79.2, 79.3, 79.4

[56] References Cited

U.S. PATENT DOCUMENTS

| | | | |
|---|---|---|---|
| 4,518,456 | 5/1985 | Bjorkholm | 156/635 X |
| 4,838,989 | 6/1989 | Ashby et al. | 156/635 X |
| 4,861,421 | 8/1989 | Bienstock | 156/635 |
| 5,057,184 | 10/1991 | Gupta et al. | 156/654 X |

OTHER PUBLICATIONS

John I. Vossen and Werner Kern, eds., *Thin Processes II*, pp. 783–856, Academic Press, Inc., 1991.
Toyama, et al., "Crack-Free PZT Thin Films Micropatterned on Silicon Substrate for Integrated Circuits", (abstract) Seiko Instruments Inc.
Watton, et al., "Materials and Technology Research in Uncooled Ferroelectric IR Detector Arrays", *Royal Signals and Radar Establishment, U.K.*, pp. 69–77.
Kauffman, et al., "Studies of Reactions of Atomic and Diatomic Cr, Mn, Fe, Co, Ni, Cu, and Zn with Molecular Water at 15 K", *Journal of Physical Chemistry*, vol. 89, No. 16, pp. 3541–3547, 1985.
Park, et al., "Reactions and Photochemistry of Atomic and Diatomic Nickel with Water at 15 k", *High Temperature Science*, pp. 1–15, vol. 25, 1988.
Hauge, et al., "Matrix Isolation Studies of the Reactions of Metal Atoms with Water", *High Temperature Science Inc.*, pp. 338–339, 1981.
Kauffman, et al., "Infrared Matrix Isolation Studies of the Interactions of Mg, Ca, Sr, and Ba Atoms and Small Clusters with Water", *High Temperature Science*, pp. 97–118, vol. 18, 1984.
Douglas, et al., "Matrix-isolation Studies by Electronic Spectroscopy of Group IIIA Metal-Water Photochemistry", *J. Chem. Soc., Faraday Trans. 1*, pp. 1533–1553, 79, 1983.1.
Douglas, et al., "Electronic Matrix Isolation Spectroscopic Studies of the Group IIA Metal-Water Photochemistry", *High Temperature Science*, pp. 201–235, vol. 17, 1984.

*Primary Examiner*—William A. Powell
*Attorney, Agent, or Firm*—Richard A. Stoltz; James C. Kesterson; Richard L. Donaldson

[57] ABSTRACT

A niobium pentoxide substrate 34 immersed in a liquid ambient (e.g. 10% hydrofluoric acid 30) and illuminated with radiation (e.g. collimated visible/ultraviolet radiation 24) produced by a radiation source (e.g. a 200 Watt mercury xenon arc lamp 20). A window 26 which is substantially transparent to the collimated radiation 24 allows the radiated energy to reach the $Nb_2O_5$ substrate 34. An etch mask (e.g. organic photoresist 32) may be positioned between the radiation source 20 and the substrate 34. The $Nb_2O_5$ substrate 34 and liquid ambient 30 are maintained at a nominal temperature (e.g. 25° C.). Without illumination, the $Nb_2O_5$ is not appreciably etched by the liquid ambient. Upon illumination the etch rate is substantially increased.

13 Claims, 1 Drawing Sheet

ANISOTROPIC NIOBIUM PENTOXIDE ETCH

CROSS-REFERENCE TO RELATED APPLICATIONS

The following related applications were filed concurrently with the instant application:

| Title | First Named Inventor | Serial Number/Status |
|---|---|---|
| Anisotropic Metal Oxide Etch | Douglas | 07/871,862 filed 4/20/92, pending application |
| Anisotropic Titanate Etch | Douglas | 07/871,862 filed 4/20/92, pending application |
| Anisotropic Barium Strontium Titanate Etch | Douglas | 07/870,988 filed 4/20/90, now allowed |
| Anisotropic Tantalum Pentoxide Etch | Douglas | 07/872,702 filed 4/20/90, now allowed |

FIELD OF THE INVENTION

This invention generally relates to methods of anisotropically etching niobium pentoxide.

BACKGROUND OF THE INVENTION

Without limiting the scope of the invention, its background is described in connection with current methods of etching metal oxides, as an example.

Metal oxide materials such as niobium pentoxide ($Nb_2O_5$), because of their electrical and mechanical properties, having found many uses in the field of electronics. The very high dielectric constants exhibited by many metal oxide compounds make them useful as the dielectric material in capacitors, especially in the miniature capacitors which are built into many integrated circuits (e.g. dynamic RAMs). Many metal oxide materials also have a positive temperature coefficient of electrical resistance, which allows devices to be made which protect electrical motors from damage due to over-current conditions. The piezoelectrical properties of these materials are widely used, as in the precise control of the length of laser cavities, for example. Microminiature structures which incorporate metal oxide material are being used to sense infrared radiation, obviating the need for bandgap detector materials which require cryogenic cooling to sense the infrared.

Metal oxide materials are often etched during the fabrication of the electrical devices which exploit their beneficial properties. A method used to etch metal oxides should generally do so without introducing damage which would unacceptably change the properties of the material on which the function of the eventual devices depends. In addition, an anisotropic etch method is usually desired so that detail in the etch mask pattern is preserved. Contamination of the metal oxide material (and/or nearby materials) by the etch method usually cannot be tolerated.

Heretofore, in this field $Nb_2O_5$ has been etched by isotropic wet etching using highly concentrated hydrofluoric acid (e.g. 49% HF).

SUMMARY OF THE INVENTION

It has been discovered that current methods of etching $Nb_2O_5$ can produce unacceptable results. Isotropic wet etching can undercut the etch mask (generally by the same distance at the etch depth), leading to features in the underlying $Nb_2O_5$ material which are not true to the etch mask pattern.

Generally, and in one form of the invention, anisotropic etching of $Nb_2O_5$ is accomplished by immersing a surface of the material in a liquid ambient and then exposing it to electromagnetic radiation (e.g. ultraviolet light), causing illuminated portions of the surface to be etched and unilluminated portions to remain substantially unetched. The process presented is therefore an anisotropic liquid phase photochemical etch. Preferably, $Nb_2O_5$ is etched by immersing it in 10% hydrofluoric acid illuminating portions the surface with visible and ultraviolet radiation produced by a mercury xenon arc lamp. An etch mask may be used to define the pattern of illumination at the surface and thereby define the etch pattern. The highly directional nature of light makes this an anisotropic etch method.

This is apparently the first $Nb_2O_5$ etch method to make use of electronic excitation caused by photo-irradiation in a reaction between $Nb_2O_5$ and a liquid ambient (e.g. 10% hydrofluoric acid). An advantage of the invention is that it anisotropic (i.e. does not cause substantial undercut). Those regions under the mask remain in shadow and are not appreciably etched. In addition, it has been found that this method does not cause unacceptable defects in the $Nb_2O_5$ material, and contamination is minimized.

BRIEF DESCRIPTION OF THE DRAWING

The novel features believed characteristic of the invention are set forth in the appended claims. The invention itself, however, as well as other features and advantages thereof, will be best understood by reference to the detailed description which follows, read in conjunction with the accompanying drawing.

In the drawing.

DETAILED DESCRIPTION OF THE PREFERRED EMBODIMENTS

Figure 1:
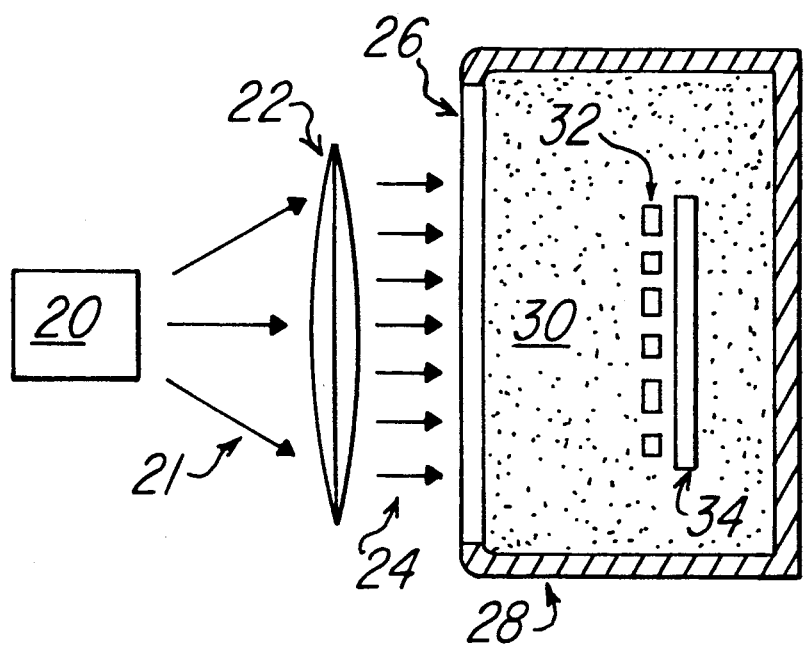
FIG. 1 is a representation of the apparatus and materials used to anisotropically etch $Nb_2O_5$.

In the preferred embodiment of this invention and with reference to FIG. 1, a pattern is etched into a substrate 34 of niobium pentoxide ($Nb_2O_5$) which is immersed in 10% hydrofluoric acid (HF) 30 and illuminated with substantially collimated visible/ultraviolet radiation 24 propagating substantially orthogonal to the substrate surface 34 produced by a 200 Watt mercury xenon arc lamp 20. Radiation 21 from the radiation source 20 is collimated by collimating optics 22 and the resulting collimated radiation 24 is directed at the substrate 34. A window 26 which is a portion of the reaction vessel 28 and which is substantially transparent to the collimated radiation allows the radiated energy to reach the $Nb_2O_5$ substrate 34. An etch mask 32 defines the etched pattern by blocking the radiation at portions of the substrate. The $Nb_2O_5$ substrate 34 and acid solution 30 are nominally at a temperature of 25° C. At such a temperature and acid concentration and without illumination, $Nb_2O_5$ is not appreciably etched. Upon illumination by visible/ultraviolet radiation produced by the lamp, however, the etch rate is increased, Etch rate ratios as high as 9:1 (illuminated:unilluminated) have been observed. It is believed, in part because of the relatively low power of the light source, that the etching reaction is accelerated in the illuminated areas because of electronic excitation due to photo-irradiation rather than from thermal effects. As used herein, the term "radiation" means radiation at levels above background and this means, for example, illumination at levels substantially greater than room lighting.

The etch mask 32 between the radiation source 20 and the Nb₂O₅ substrate 34 is preferably located close to or in contact with the surface to be etched. Such an etch mask 32 may be deposited onto the substrate surface. The etch mask 32 is preferably an organic photoresist. In general, any substance which is sufficiently opaque to visible and ultraviolet light such as that produced by the mercury xenon lamp and which is not substantially penetrated or etched by the liquid ambient may be used. Those areas of the substrate not covered by the mask material will be subject to etching.

In alternate embodiments, the liquid ambient may be from the class of solutions that etch the material without light irradiation. In this case, the radiation accelerates the etch rate on illuminated portions of the substrate, resulting in a less isotropic etch. Still other alternate embodiments include liquid ambients containing salts and liquid ambients with pH values less than or equal to seven (i.e. acids and neutral solutions). Still other alternate embodiments include liquid ambients with pH values in the alkaline range (i.e. greater than seven), although neutral and acidic solutions are greatly preferred and have given excellent results as described in the preferred embodiment of this invention.

In an additional aspect to this method, sidewall profile control can be enhanced by introducing a passivating agent into the liquid ambient 30 that does not react with the material being etched to form a soluble product or only slightly soluble product. The passivating agent "poisons" the sidewalls with respect to attack by other etch reagents on the sidewalls, but does not stop etching normal to the substrate because the irradiation detaches the passivating agent from the surface. An example of a passivating agent in an etch of Nb₂O₅ is hydrochloric acid.

In another alternate embodiment of this invention, a pattern may be etched into the surface of a titanate material by projecting a patterned light onto the substrate. Conventional photo-lithography is one technique to provide such a patterned light.

In yet other alternate embodiments of this invention, the liquid ambient may be made to flow with respect to the substrate. The flow rate of the liquid ambient may be varied. The solution temperature can be varied to achieve different etch rates and etch anisotropy. The photon flux may be varied to impact etch directionality and etch rates. The radiation wavelength can be adjusted to achieve different etch directionality and etch rates. The direction of propagation of the radiation need not be normal to the surface. The etch solution may be a mixture of solutions (e.g. one or more passivating agents to enhance anisotropy and one or more reagents to photochemically etch the material).

The sole Table, below, provides an overview of some embodiments and the drawing.

TABLE

| Drawing Element | Generic Term | Preferred or Specific Term | Alternate Terms |
|---|---|---|---|
| 20 | Radiation Source | 200 Watt mercury/xenon arc lamp | |
| 21 | Radiation | Visible/UV light | Radiation which will penetrate the liquid ambient |
| 22 | Collimating Optics | | |
| 24 | Collimated Radiation | Visible/UV light propagating normal to substrate surface | |
| 26 | Transparent Window | | |
| 28 | Reaction Vessel | | |
| 30 | Liquid Ambient | 10% hydrofluoric acid | Other etch constituents such as buffered HF, 1% HF, 49% HF. Passivating agents such as hydrochloric acid. Mixtures of both. |
| 32 | Etch Mask | organic photoresist | silicon nitride Noble metals such as platinum |
| 34 | Nb₂O₅Substrate | Nb₂O₅ Substrate | |

A few embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method to anisotropically etch niobium pentoxide comprising the steps of
    (a) submersing a surface of said niobium pentoxide in a liquid ambient; and
    (b) illuminating portions of said surface with radiation, thereby etching said illuminated portions of said surface at a substantially greater rate than the unilluminated portions of said surface.

2. The method according to claim 1, wherein said illuminated portions of said surface are at a temperature substantially the same as the temperature of the unilluminated portions of said surface.

3. The method according to claim 1, wherein said liquid ambient is comprised of hydrofluoric acid.

4. The method according to claim 1, wherein said radiation is produced by a mercury xenon arc lamp.

5. The method according to claim 1, wherein the direction of propagation of said radiation is substantially orthogonal to said surface.

6. The method according to claim 1, wherein an etch mask is interposed between the source of said radiation and said surface, whereby portions of said surface are not illuminated.

7. The method according to claim 6, wherein said etch mask is comprised of organic photoresist.

8. The method according to claim 6, wherein said etch mask is silicon nitride.

9. The method according to claim 6, wherein said etch mask is a noble metal.

10. The method according to claim 9, wherein said noble metal is platinum.

11. The method according to claim 1, wherein said liquid ambient is acidic.

12. The method according to claim 1, wherein said liquid ambient is comprised of a salt solution.

13. A method to anisotropically etch niobium pentoxide comprising the steps of
    (a) immersing a surface of said niobium pentoxide in 10% hydrofluoric acid; and
    (b) illuminating portions of said surface with radiation produced by a mercury xenon arc lamp, thereby etching said illuminated portions of said surface at a substantially greater rate than the illuminated portions of said surface.

* * * * *